United States Patent [19]
Vernon

[11] Patent Number: 6,150,060
[45] Date of Patent: Nov. 21, 2000

[54] DEFECT TOLERANT TRANSMISSION LITHOGRAPHY MASK

[75] Inventor: Stephen P. Vernon, Pleasanton, Calif.

[73] Assignee: The Regents of the University of California, Oakland, Calif.

[21] Appl. No.: 09/227,847

[22] Filed: Jan. 11, 1999

[51] Int. Cl.7 ...................................................... G03F 9/00
[52] U.S. Cl. ................................................................ 430/5
[58] Field of Search .............................. 430/5, 322, 323, 430/324, 311; 378/35

[56] References Cited

U.S. PATENT DOCUMENTS

| | | | |
|---|---|---|---|
| 5,279,925 | 1/1994 | Berger et al. | 430/5 |
| 5,472,811 | 12/1995 | Vasudev et al. | 430/5 |
| 5,514,499 | 5/1996 | Iwamatsu et al. | 430/5 |
| 5,935,737 | 8/1999 | Yan | 430/5 |
| 5,962,174 | 10/1999 | Pierrat | 430/5 |

Primary Examiner—S. Rosasco
Attorney, Agent, or Firm—Daryl S. Grzybicki; L. E. Carnahan; Alan H. Thompson

[57] ABSTRACT

A transmission lithography mask that utilizes a transparent substrate or a partially transparent membrane as the active region of the mask. A reflective single layer or multilayer coating is deposited on the membrane surface facing the illumination system. The coating is selectively patterned (removed) to form transmissive (bright) regions. Structural imperfections and defects in the coating have negligible effect on the aerial image of the mask master pattern since the coating is used to reflect radiation out of the entrance pupil of the imaging system. Similarly, structural imperfections in the clear regions of the membrane have little influence on the amplitude or phase of the transmitted electromagnetic fields. Since the mask "discards," rather than absorbs, unwanted radiation, it has reduced optical absorption and reduced thermal loading as compared to conventional designs. For EUV applications, the mask circumvents the phase defect problem, and is independent of the thermal load during exposure.

19 Claims, 1 Drawing Sheet

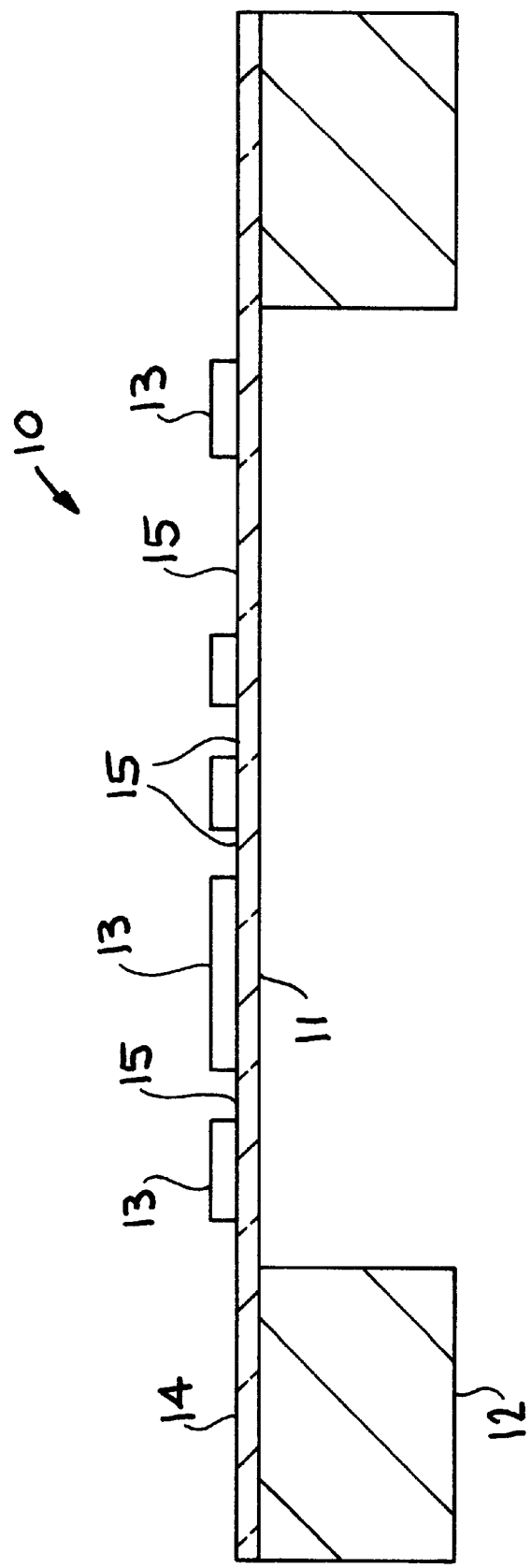

DEFECT TOLERANT TRANSMISSION LITHOGRAPHY MASK

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to lithography masks, particularly to transmission and attenuating phase-shift masks, and more particularly to a defect tolerant transmission lithography mask which has reduced optical absorption and reduced thermal loading.

Over the years various types of lithography masks have been developed in efforts to improve the lithographic technology. The following exemplifies prior masks.

Lithographic printing with 36 nm radiation using transmission masks of the open stencil type has been demonstrated by V. D. W. Berreman et al., "Soft-X-Ray Projection Lithography, Printing of 0.2 $\mu$m Features Using 20:1 Reduction," Optics Letters 15, pp. 529–531 (1990). The transmission mask was formed using a combination of electron-beam lithography and reactive-ion etching to open patterned holes in a 1 mm×1 mm×700 $\mu$m thick silicon (Si) membrane. A film of 30 $\mu$m of gold (Au) was deposited on both sides of the membrane to increase the mask contrast.

A reflection type lithography mask usable to print a pattern upon a semiconductor wafer by the use of soft x-rays is disclosed in U.S. Pat. No. 5,052,033 issued Sep. 24, 1991, to Ikeda et al. In this patent all embodiments utilize reflective and nonreflective regions of the mask to provide a high contrast pattern. The reflective region consists of a multilayer film formed on a substrate by layering different materials having different refractive indices. Two approaches are identified therein to fabricate the patterned mask: (1) a nonreflective portion is formed on the reflecting surface, and (2) a pattern comprising the multilayer structure may be formed upon a nonreflective substrate.

Potential sources of defects in the open-stencil mask design include nonuniform membrane thickness, sidewall slope errors, and nonuniformity of the overcoat that serves to adjust the optical contrast. While repair of the overcoat is straightforward, repair of membrane thickness errors and sidewall slope errors presents a daunting technical challenge.

Reflection mask designs employing multilayer coatings require that the multilayer reflective regions of the mask are free of defects--there is no practical method for repairing defective regions of the multilayer coating. Defects in the multilayer coated regions of the sample can arise from several sources, including both structural flaws in the coating, and substrate imperfections that are replicated in the multilayer coating process.

Finally, the open-stencil and reflection mask designs absorb radiation that is not transmitted through the open region or reflected by the multilayer coating. During lithographic exposure, the mask is subject to a spatially varying thermal load produced by pattern-dependent optical absorption; this results in a spatially varying distortion of the mask pattern.

The present invention overcomes the above-identified problems by providing a defect tolerant transmission lithography mask, which provides several advantages over conventional lithography mask designs, which include being insensitive to defects in the membrane and reflective coating, is independent of the thermal load during exposure, and for extreme ultraviolet (EUV) it circumvents phase defect problems. The transmission lithography mask of the present invention utilizes a transparent substrate or a partially transparent membrane as the active region of the mask, on which is deposited a reflective coating on only the side facing the illumination system; the coating is patterned to form transmissive regions. Since the mask "discards," rather than absorbs, unwanted radiation, it has reduced optical absorption and reduced thermal loading as compared to conventional mask designs.

SUMMARY OF THE INVENTION

It is an object of the present invention to provide a defect tolerant transmission lithography mask.

A further object of the invention is to provide a transmission mask which is insensitive to defects in the membrane and reflective coating.

A further object of the invention is to provide a transmission mask in which the membrane and coating are repairable.

Another object of the invention is to provide a transmission lithography mask wherein during full field exposure the mask experiences a pattern-independent uniform thermal load.

Another object of the invention is to provide a transmission lithography mask wherein thermal expansion of the mask during full field exposure can be compensated by adjustment of the magnification.

Another object of the invention is to provide a transmission lithography mask which permits telecentric mask illumination.

Another object of the invention is to provide a defect tolerant transmission mask which is applicable to optical, ultraviolet (UV), deep ultraviolet (DUV), and extreme ultraviolet (EUV) lithography.

Other objects and advantages will become apparent from the following description and accompanying drawing. The invention involves defect tolerant transmission lithography masks. The mask utilizes a transparent substrate or partially transparent membrane as the active region of the mask. The membrane is provided with a reflective single layer or multilayer coating on the surface facing the illumination system, and the coating is patterned to form transmission regions. Structural imperfections and defects in the coating have negligible effect on the aerial image of the mask master pattern since the coating is used to reflect radiation out of the entrance pupil of the imaging system. Also, structural imperfections in the clear regions of the membrane have little influence on the amplitude or phase of the transmitted electromagnetic fields. Thus use of the mask for EUV applications circumvents the phase defect problem. In addition, distortion of the mask due to non-uniform optical absorption is minimized and may be compensated by adjustment of the magnification. Thus the mask of the present invention may be utilized in soft x-ray projection lithography, extreme UV lithography, DUV lithography and, optical lithography, transmission masks, and attenuation phase-shift masks.

BRIEF DESCRIPTION OF THE DRAWINGS

The accompanying drawing, which is incorporated into and forms a part of the disclosure, illustrates an embodiment of the invention and, together with the description, serves to explain the principles of the invention.

The single FIGURE is a cross-sectional view of an embodiment of a defect tolerant transmission lithography mask, made in accordance with the present invention.

DETAILED DESCRIPTION OF THE INVENTION

The present invention is directed to defect tolerant transmission lithography masks that utilize a transparent substrate or a partially transparent membrane as the active region of the mask. A reflective single layer or multilayer coating is deposited on the membrane surface facing the illumination system. The coating is selectively patterned (removed) to form transmissive (bright) regions. Structural imperfections and defects in the coating have negligible effect on the aerial image of the mask master pattern since the coating is used to reflect radiation out of the entrance pupil of the imaging system. Similarly, structural imperfections in the clear regions of the membrane have little influence on the amplitude or phase of the transmitted electromagnetic fields. Since the mask "discards," rather than absorbs, unwanted radiation, it has reduced absorption and reduced thermal loading as compared to conventional mask designs.

The defect tolerant transmission mask of the present invention offers the following advantages over conventional lithography mask designs:

1. It is insensitive to defects in the substrate or membrane and reflective coating.
2. The membrane and coating are repairable.
3. In full field exposure the mask experiences a pattern-independent uniform thermal load.
4. In full field exposure thermal expansion of the mask can be compensated by adjustment of the magnification.
5. The design permits telecentric mask illumination.
6. For EUV applications, it circumvents phase defect problems.
7. Is applicable to optical, UV, DUV, and EUV lithography.

The drawing illustrates, in cross-section, an embodiment of the architecture of a defect tolerant transmission lithography mask of the present invention. The mask, generally indicated at 10, is formed on a transparent substrate or partially transparent membrane 11 held by a support structure 12. A reflective coating 13, which may be a single layer or multilayer, is formed (deposited) on the membrane 11 on only the side 14 facing an illumination system. The reflective coating 13 is selectively patterned (removed) to form transmissive (bright) regions 15. The mask 10 operates in transmission. The coating 13 is used to reflect incident radiation out of the entrance pupil of the imaging system; coated regions of the membrane correspond to dark regions in the aerial image. If the membrane 11 is of sufficient structural strength the support structure 12 may be omitted. In a preferred embodiment, the physical properties of the mask are selected so that the optical absorption of the structure is pattern independent. This will be the case provided that the fractional coating reflectance R, and the fractional membrane absorption A, satisfy the condition R+A=1. Thus the transmission mask of the present invention experiences a pattern independent thermal load during exposure, and for EUVL application it circumvents phase defect problems. Also, structural imperfections in either the coating or the membrane have little influence on the aerial image of the masks.

By way of example, the membrane 11 may be composed of any low absorption element or material (any metal, dielectric or insulator) that is transparent or low optical absorption at the operating wavelength. Such may include Si, $Si_3N_4$, Be, $SiO_2$, $Al_2O_3$, $CaF_2$, $MgF_2$, etc. having a thickness in the range of 100 nm to 1 cm; and the reflective coating 13 may be a single coating composed of a metal, such as Al, Cr, Ni, or Pt, having a thickness of 10 nm to 1000 nm or a multilayer coating composed of a metal, semiconductor, insulator, such as Mo, Si, Be, Al, Cr, $MgF_2$, $CaF_2$, $LaF_3$, NaF, LiF, $BeF_2$, $BaF_2$, $SiF_2$, Mo, Si, or Mo, Be or combinations thereof having an overall thickness of 10 nm to 1000 nm. The coating 13 may be designed for different applications to provide a desired reflectivity ranging from about 50 percent to >99 percent. By way of specific example, low absorption may be: $\leq 10^5$ cm$^{-1}$ for visible (i.e., $SiO_2$ with an optical absorption coefficient of $10^5$ cm$^{-1}$ at 193 nm), $\leq 10^3$ cm$^{-1}$ for VUV ($CaF_2$ with an optical absorption coefficient of $10^3$ cm$^{-1}$ at 157 nm), $\leq 10^{-5}$ cm$^{-1}$ for EUV (i.e., Si with an optical absorption coefficient of $5 \times 10^2$ nm at 13 nm).

It has thus been shown that the present invention provides a solution to prior known problems associated with lithographic masks, by providing defect tolerant transmission lithography masks, where defects in either the membrane or the coating have negligible adverse effects. The mask thermal load during exposure is independent of the mask pattern, and for applications, such as for EUV, it circumvents phase defect problems. The defect-tolerant mask of this invention may be utilized for transmission and attenuating phase-shift masks, and in various lithography systems, including soft x-ray projection, UV, EUV, DUV, and optical.

While a particular embodiment of the invention has been illustrated and described, along with particular materials and parameters, such are not intended to be limiting. Modifications and changes may become apparent to those skilled in the art, and it is intended that the invention be limited only by the scope of the appended claims.

The invention claimed is:

1. A defect tolerant transmission mask consisting of:
    a membrane, and
    a reflective or partially reflective coating on only one side of said membrane,
    said coating having patterned openings therein to expose areas of said membrane.

2. The transmission mask of claim 1, wherein said membrane is composed of either transparent materials, or partially transparent materials.

3. The transmission mask of claim 1, wherein said coating is selected from the group consisting of single layers and multiple layers.

4. The transmission mask of claim 3, wherein said coating is composed of a single layer selected from the group consisting of Al, Cr, Ni, or Pt.

5. The transmission mask of claim 3, wherein said coating is composed of material selected from the group consisting of metals, semiconductors, and insulators.

6. The transmission mask of claim 3, wherein said coating is composed of multiple layers selected from the group of Mo, Si, Be, Al, $MgF_2$, Cr, $CAF_2$, $MgF_2$, $LaF_3$, NaF, LiF, $BeF_2$, $BaF_2$, and $SrF_2$.

7. The transmission mask of claim 1, wherein said coating has a thickness of 10 nm to 10 μm.

8. The transmission mask of claim 1, wherein said membrane is composed of material selected from the group consisting of Si, Be, and $Si_3N_4$.

9. The transmission mask of claim 1, additionally including support means for said membrane.

10. The transmission mask of claim 1, wherein said membrane and said coating are composed of materials having physical properties so that the optical absorption thereof is pattern independent.

11. The transmission mask of claim 10, wherein the materials of the coating and membrane provide a fractional coating reflectance R and a fractional membrane absorption A, that satisfy the condition R+A=1.

12. In a lithography system utilizing masks, the improvement comprising:

a defect tolerant transmission lithography mask having a patterned reflective or partially reflective coating on only one side thereof, and having a thermal load during exposure which is independent of mask pattern.

13. The lithography system of claim 12, wherein said transmission lithography mask comprises:

a transparent or partially transparent substrate held by a support structure, and a patterned or partially patterned reflective coating on a surface of the substrate facing an illumination system to reflect incident radiation out of the entrance pupil of an imaging system, said coating having openings therein to expose areas of said substrate, whereby coated regions of the substrate correspond to dark regions in the aerial image.

14. The improvement of claim 13, wherein said substrate is composed of material selected from the group consisting of $CaF_2$, $MgF_2$, $SiO_2$, Si, $Si_3N_4$, and C, and has a thickness in the range of 50 nm to 2 cm.

15. The improvement of claim 14, wherein said coating is selected from the group consisting of single layer and multiple layer coatings, having a thickness in the range of 10 nm to 10 $\mu$m.

16. The improvement of claim 15, wherein said coating is composed of a single layer selected from the group consisting of Al, Cr, Ni, and Pt.

17. The improvement of claim 15, wherein said coating is composed of multilayers selected from the group composed of multilayers selected from the group consisting of Al, Cr, Mo, Si, Be, Ru, $CaF_2$, $MgF_2$, $LaF_3$, $BeF_2$, $BaF_2$, LiF, NaF, and $SrF_2$.

18. The improvement of claim 12, wherein said mask is constructed to discard, rather than absorb, unwanted radiation, whereby reduced optical absorption and reduced thermal loading is provided.

19. The improvement of claim 12, wherein said mask has physical properties such that the optical absorption is pattern independent, and wherein the fractional coating reflectance R and the fractional substrate absorption A, satisfy the condition R+A=1.

* * * * *